United States Patent [19]
Eisig

[11] Patent Number: 5,457,648
[45] Date of Patent: Oct. 10, 1995

[54] RANDOM ACCESS MEMORY WITH DIGITAL SIGNALS RUNNING OVER THE SMALL SIGNAL REGION OF THE ARRAY

[75] Inventor: David Eisig, Haifa, Israel

[73] Assignee: Intel Corporation, Santa Clara, Calif.

[21] Appl. No.: 208,800

[22] Filed: Mar. 9, 1994

Related U.S. Application Data

[63] Continuation of Ser. No. 958,244, Oct. 8, 1992, abandoned.

[51] Int. Cl.$^6$ .................................................. G11C 5/06
[52] U.S. Cl. ................................ 365/63; 365/51; 365/69
[58] Field of Search .................................. 365/51, 63, 69, 365/206

[56] References Cited

U.S. PATENT DOCUMENTS

| | | | |
|---|---|---|---|
| 4,916,661 | 4/1990 | Nawoki et al. | 365/51 |
| 5,014,241 | 5/1991 | Asakura et al. | 365/51 |
| 5,214,601 | 5/1993 | Hidaka et al. | 365/51 |
| 5,280,441 | 1/1994 | Wada et al. | 365/51 |

Primary Examiner—David C. Nelms
Assistant Examiner—F. Niranjan
Attorney, Agent, or Firm—Blakely, Sokoloff, Taylor & Zafman

[57] ABSTRACT

A novel semiconductor memory having a plurality of storage devices arranged in and X-Y array wherein the Input and Output data lines of the array are routed over a portion of the memory array. The Input and Output data lines are routed symmetrically between and in parallel with the small-signal bit-line pairs of the array which access the individual storage devices. The individual bit-lines of a bit-line pair cross-over one another at the midpoint of the portion of the array over which the Input and Output lines am routed. Buffers are included on the Input and Output lines at the periphery of the array in order to prevent noise external to the array from being transmitted into the array on the I/O data lines above the array. Output buffers are also provided to drive output data out across the array. Additionally, circuitry is provided for preventing the Input and Output lines from transitioning while small-signals are being developed on the bit-line pairs.

16 Claims, 5 Drawing Sheets

5,457,648

RANDOM ACCESS MEMORY WITH DIGITAL SIGNALS RUNNING OVER THE SMALL SIGNAL REGION OF THE ARRAY

This is a continuation of application Ser. No. 07/958,244, filed Oct. 8, 1992 now abandoned.

BACKGROUND OF THE INVENTION

1. Field of the Invention

The present invention relates to the field of semiconductor memories, and more specifically, to a semiconductor random access memory with large-signal I/O lines routed over the small-signal region of the memory.

2. Description of Related Art

In modern complex integrated circuits the layout of the various components or logical blocks of the circuit is extremely important. The goal is to use, as efficiently and as economically as possible, the limited amount of silicon area available on a die. This implies that silicon area is mainly used for active devices and components and not for interconnections or signal line routing. Another goal in circuit layout design is to improve circuit performance by placing and orienting those logical components next to each other which frequently interact with one another.

Microprocessor integrated circuit design is one application where circuit layout is very important. Microprocessors are comprised of many discrete units such as multipliers, adders, registers, bus controllers, and "on chip" memories or caches, etc. The positioning and orientation of these blocks relative to one another is important for overall microprocessor performance and circuit packing density. One of the largest consumers of silicon area in a microprocessor is the "on chip" cache or memory. As microprocessors become more and more complicated the size and performance requirements of "on chip" memories or caches are increasing.

There have been a couple of different layout schemes proposed for the layout of large on chip caches. One scheme, shown in FIG. 1, simply adds more rows to the array. A problem with this technique, however, is that as more rows are added to the array the bit-lines which access a column of cells become larger. As bit-lines become longer, access speeds decrease and device performance suffers. In an attempt to solve the problem of excessively long bit-lines and resulting poor performance, large memory arrays having a "butterfly" configuration, as shown in FIG. 2, have been proposed. This technique places the Sense-Amps and the Input/Output logic of the array at the center of the array, and forms two smaller arrays on either side of the I/O logic. The bit-line lengths in this configuration are only half as long as similar size memory arrays. This configuration increases the speed performance of the array. Unfortunately, however, in order to interconnect the I/O lines to the I/O logic at the center of the array, the I/O lines are routed around the side of the array. This technique consumes an unacceptable amount of silicon area, which in modern high-density integrated circuits is better used to form active devices than for routing I/O lines to the array.

Thus, what is desired is a novel layout for a large memory array which efficiently utilizes the available silicon area for the array, which has good performance, and which allows a circuit designer a great deal of freedom in choosing a layout for the array and a layout for the logical components coupled to the array.

SUMMARY OF THE INVENTION

A novel semiconductor memory having a plurality of standard six-transistor CMOS SRAM cells arranged in an upper and lower X-Y array. I/O logic and Sense-Amps of the array are positioned at the center of the array. A plurality of Input and Output lines which supply data to and from the memory array are routed over the upper array to the I/O logic at the center of the array. The I/O Logic controls the reading and writing of data into the individual memory cells. Bit line pairs access data stored in a specific column of the array. The two individual bit-lines of each bit-line pair cross-over at a midpoint of the upper array. Individual Input and Output lines are routed in parallel with and symmetrically between bit-line pairs of the upper array. Buffers are included on each of the Input and Output lines at the periphery of the upper array to prevent noise from being transmitted into the array. Additionally, buffers are provided on the Output lines at the center of the array in the I/O logic to drive the Output data out over the upper array at specified times. Circuit means is provided for preventing the Input and Output lines of the array from transitioning while voltage is being developed on the small-signal lines.

A goal of the present invention is to allow a circuit designer a great deal of freedom to optimize the layout of a memory (form-factor) utilized in an integrated circuit.

Another goal of the present invention is to provide a design for a large memory array which exhibits good performance characteristics and which efficiently utilizes available silicon area.

Still another goal of the present invention is to efficiently utilize the available silicon area of an integrated circuit by muting the I/O lines above the small-signal region of the array.

Still yet another goal of the present invention is to provide several techniques which can be used singularly or in combination to reduce the adverse effects of noise coupling of the large-signal Input and Output lines which run over the memory array to the small-signal bit-lines which access data from the individual memory cells of the array. By reducing the effect of noise coupling from the Input and Output lines to the bit-lines, potential data misreads can be avoided.

DETAILED DESCRIPTION OF THE PRESENT INVENTION

The present invention is a novel random access semiconductor memory having a plurality of storage cells arranged in an X-Y array with the I/O data lines of the array routed over a portion of the small-signal region of the array. In the following description, numerous specific details are set forth in detail, such as cell types and configurations, and array sizes and shapes, etc. in order to provide a thorough understanding of the present invention. However, it may be obvious to one skilled in the art that the present invention may be practiced without these specific details. In other instances, well-known I/O logic such as read/write logic, addressing logic and Sense-Amps, etc. have not been set forth in detail in order to not unnecessarily obscure the present invention.

Figure 1:
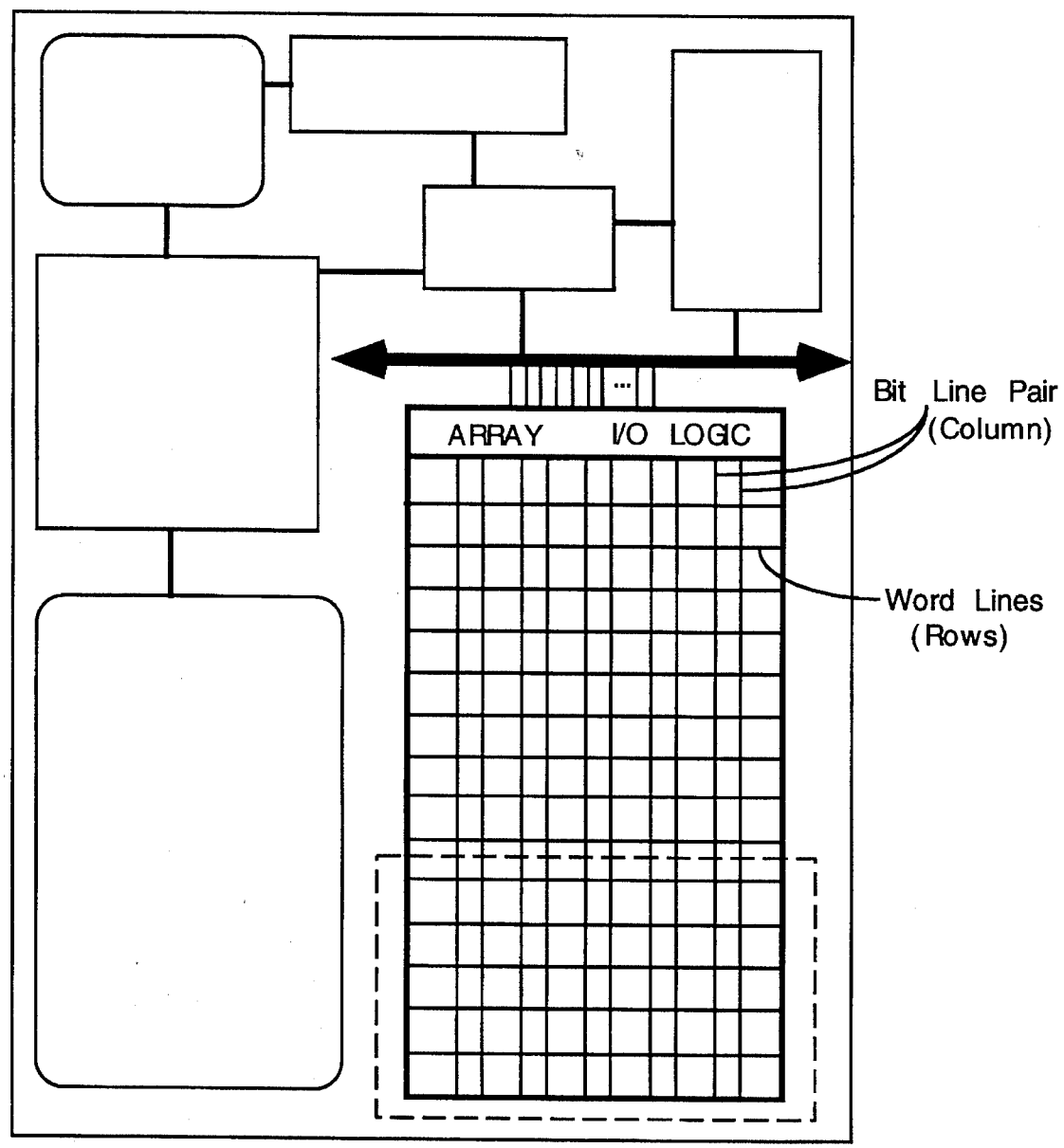
FIG. 1 is an illustration of a microprocessor having a large on chip memory with excessively long bit-lines.
Figure 2:
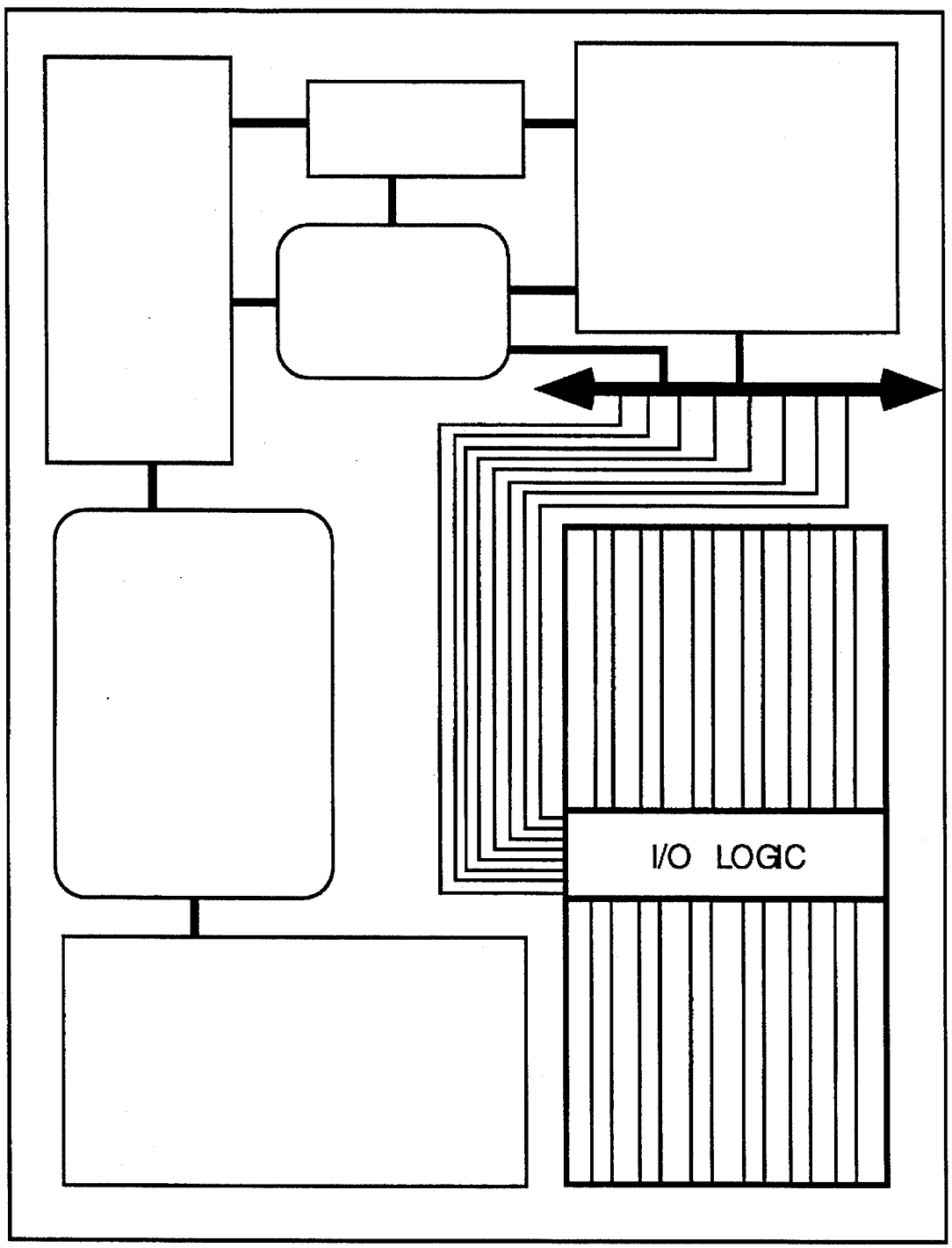
FIG. 2 is an illustration of a microprocessor with a large on chip memory where the memory has a butterfly configuration and I/0 lines routed around the side of the array to I/O logic located at the center of the array.
Figure 3:
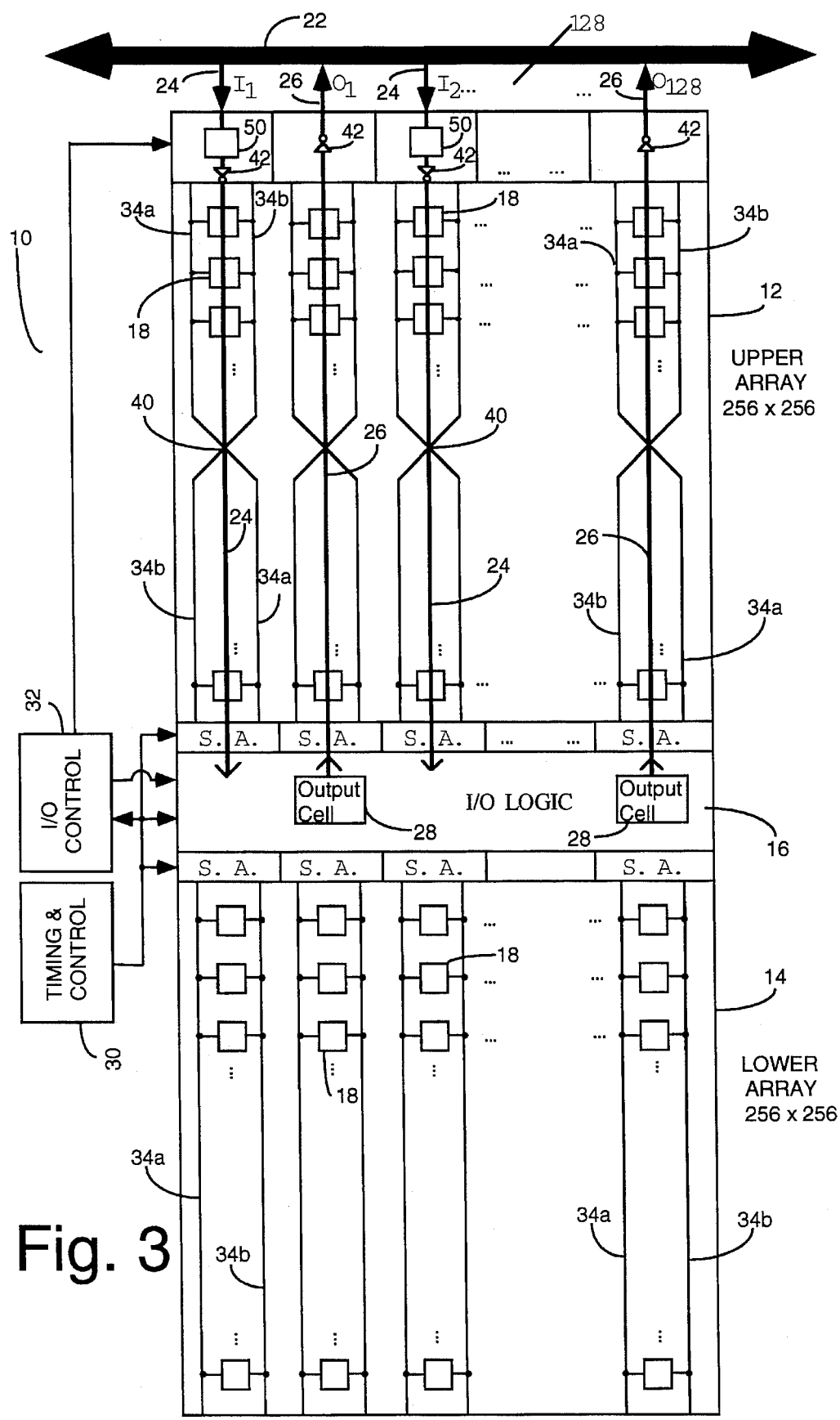
FIG. 3 is an illustration of the semiconductor memory of the present invention where large-signal I/0 lines are routed over a portion of the small-signal region of the memory.

The present invention is a novel layout for a "on chip" semiconductor memory array 10 or "cache" of a microprocessor. As shown in FIG. 3 the memory array has a butterfly configuration with an upper 12 and lower 14 array positioned around the I/O logic 16 of the array. Both the lower 14 and upper 12 array are comprised of 256×256 standard six-transistor CMOS SRAM cells 18 arranged in an X-Y array (i.e., arranged in rows and columns). The array has the capacity to hold over 16 Kbytes of information at any one time. Sense-Amplifiers 20 and Input/Output logic are provided at the center of the array 10. Up to 128 bits of data can be accessed simultaneously from the array 10 at any one time. An I/O bus 22 supplies 128 data Input lines 24 and 128 data Output lines 26 to the array. The I/O lines provide data exchange between the memory array and other components of the microprocessor or components outside of the microprocessor.

The array in the preferred embodiment has a "butterfly" configuration. In a memory array with a butterfly configuration the I/O logic 16 is located at the center of the array. The I/O logic 16 is responsible for receiving data on the Input lines 24 and writing it into addressed storage cells. Likewise the I/O logic 16 is responsible for reading data from addressed storage cells 18 and outputting the new data on the Output lines 26. Each of the data Input lines 24 and data Output lines 26 are multiplexed to four different columns of the array 10. The I/O logic 16 comprises well-known circuitry for controlling the reading from and writing to the array 10. Output cells 28 are included in the I/O logic 16 at the center of the array to drive data at predetermined times out across the upper array 12 to bus 22. By dividing the array into two components and by providing the timing logic 30, control logic 32, and Sense-Amps 20 at the center of the array, the bit-lines 34a and 34b of the array are able to be kept short. That is, the bit-line length is half as long as similar capacity data array which does not utilize a butterfly configuration. The length of the individual bit-lines is directly related to the speed of the memory. By utilizing the butterfly configuration a large memory array can be fabricated without degrading performance due to excessively long bit-lines needed to access the individual memory cells.

As is evident in FIG. 3, the individual I/O lines 24 and 26 are routed from the I/O bus 22 over the upper portion 12 of the array 10 to the I/O logic 16 contained at the center of the array 10. The direct muting of the I/O lines over the array 10 in the present invention allows shorter I/O lines 24 and 26 to be used which decreases line capacitance (which affects speed) of the I/O lines 24 and 26. Additionally, by muting the I/O lines 24 and 26 over the array 10, a significant amount of silicon area is saved because the I/O lines 24 and 26 do not have to be routed around the side of the array 10 to the control logic 16. Silicon area is always of limited supply in modern high-density integrated circuits. Furthermore, by routing the I/O lines 24 and 26 over the array 10, a greater degree of flexibility in placement and orientation of the array 10 is given to a designer in laying out an integrated circuit containing the memory array 10 of the present invention.

Figure 4:
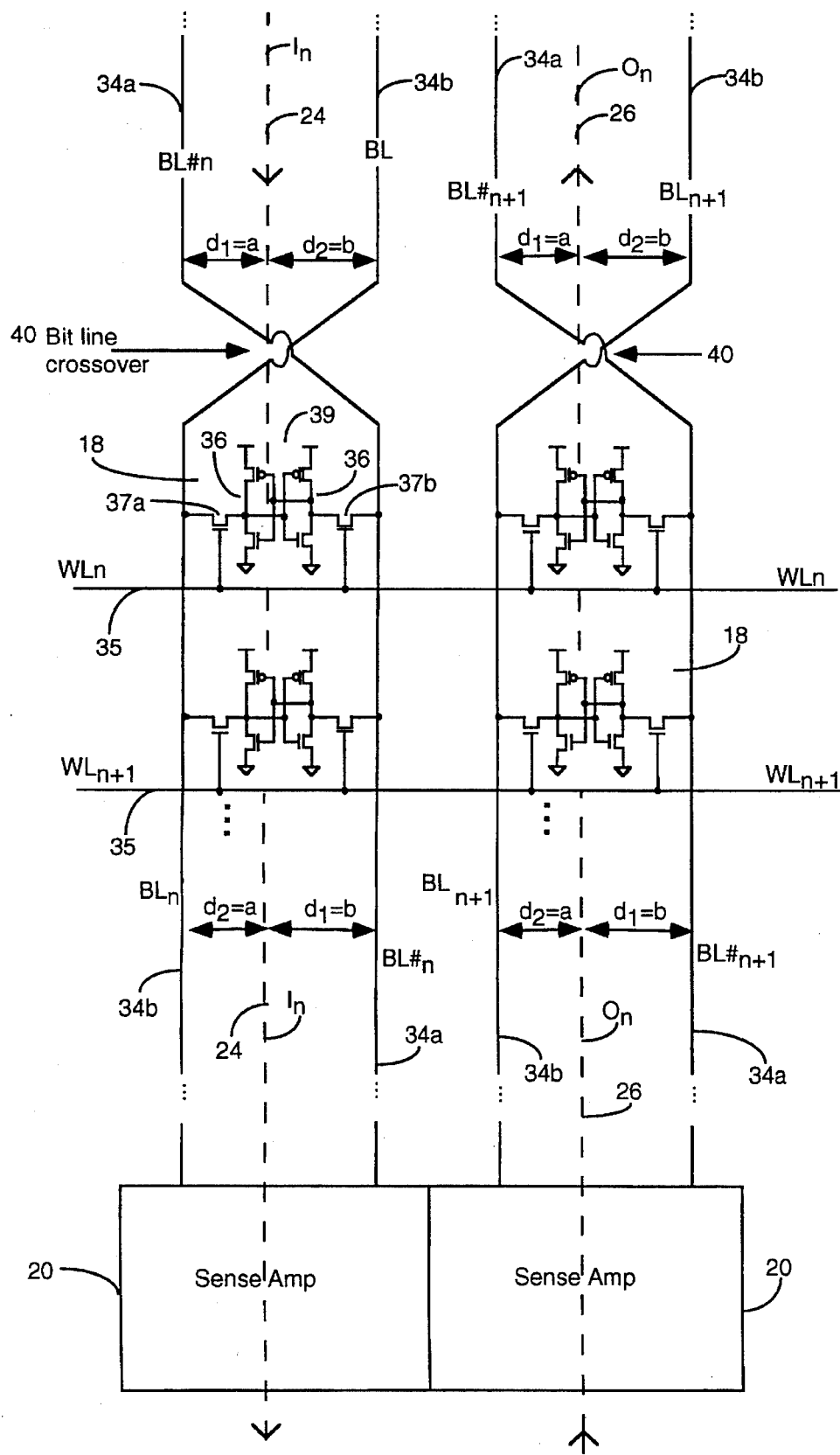
FIG. 4 is an illustration of a six-transistor CMOS storage cells used in the semiconductor memory of the present invention.

FIG. 4 details part of the upper array 12 and shows four individual CMOS SRAM storage cells 18. Each individual SRAM cell 18 stores one bit of data. Each row of cells is coupled to the same Word Line (X coordinate) and each column of cells is coupled to the same pair of bit-lines BL and BL#(Y coordinate). Each pair of bit-lines 34 is coupled to an individual Sense-Amp 20. An individual cell 18 is accessed by providing an address to the array, which is decoded by well-known address logic (not shown), which selects respective word line and bit-line pairs. In order to read data from or write data to a specific cell in the array both the word line and bit-lines of the cell must be selected. In the standard six-transistor cell 18 a pair of transistors 37a and 37b are used to coupled the storage cell to respective bit-line pairs. The storage means in the present invention comprises a pair of well-known cross-coupled CMOS inverters 36. Each inverter is formed from an N-type MOS transistor and a P-type MOS transistor. Each CMOS inverter has its gates coupled to the source/drain coupling of the other inverter.

Data is read from a cell 18 by pulsing the Word Line high so that the N-type transistors 37a and 37b of a given cell conduct and thereby couple the storage element of the cell to its respective bit-lines BL and BL#. The selected memory cell discharges one of the bit-lines. If the BL bit-line is discharged, a logical 0 is being read. If BL#is discharged, a logical 1 is being read. The bit-lines are not discharged entirely to zero volts because this would take a long time to do since the transistors in the memory are small, and the bit-lines have high capacitance since hundreds of memory cells are connected to them. The bit-lines 34a and 34b are, therefore, just discharged a small amount, but enough so that the Sense-Amplifiers 20 can detect the voltage difference between BL and BL# signals. The Sense-Amp detects whether BL has a lower voltage than BL# (logical 0) or whether BL# has a lower voltage than BL (logical 1). In the present invention, although the power supply is 5 volts, a difference of 0.4 volts between the bit-lines BL and BL# is enough to signal the stored logical state of the cell. Since small voltage differences are being developed on the bit-lines, the BL and BL# lines 34b and 34a are referred to as small-signal lines and the region of the array over which they are routed is referred to as the small-signal region of the array. The Input and Output data lines 24 and 26 of the array 10 provide full CMOS voltage level signals (i.e. zero volts for a logical "0" and five volts for a logical "1"). The Input and Output data lines 24 and 26 are therefore referred to as large-signal lines due to their full voltage levels.

By routing the large-signal I/O lines 24 and 26 over the small-signal region of the memory array, one would expect voltage (noise) coupling from the large-signal I/O lines to the small-signal bit-lines. One would expect such noise coupling to cause misreads of data. That is, since reads of data are made by comparing the voltage levels of the two bit-lines BL and BL# of the accessed cell, an I/O line running above this region of the cell may induce voltage on the bit-lines (through capacitive coupling) to an extent that the wrong bit-line has a higher/lower voltage which can cause the Sense-Amp to detect an incorrect value for the mad data. It is to be appreciated that the memory array of the present invention operates in a generally hostile noise environment, so that extra noise coupling from the I/O lines to the bit lines can readily cause misreads of data. That is, the memory array of the present invention is affected by radio frequency noise coupling from other circuits on chip, as well as on board, and by radiation noise from alpha particles, making the array especially vulnerable to misreads of data due to noise coupling from the I/O lines.

In the present invention the I/O lines are routed over the small-signal region of the array without worrying about causing misreads of data because a number of techniques are utilized to reduce the effect of noise coupling. These techniques include: placing the I/O data signal lines symmetrically between the BL and BL# bit-lines of the bit-line pairs, providing a crossover of the BL and BL# lines of individual bit-line pairs at the midpoint of the portion of the array over which the I/O lines are routed, providing buffers on the I/O lines at the periphery and at the center of the array, and controlling when the I/O signal lines transition. Each of these techniques alone helps to ensure and together guarantee that there is no misreads of data due to noise coupling from the large-signal I/O lines to the small-signal bit-lines.

As shown in FIG. 3, the individual I/O lines 24 and 26 are ideally routed symmetrically between and parallel with individual bit-line pairs which access columns of the upper array. Such routing couples the noise from the large-signal I/O lines 24 and 26 symmetrically to the bit-lines 34a and 34b of a specific column of the array. If noise is coupled asymmetrically (i.e. one bit-line is affected more than the other by noise from the I/O line) the wrong bit-line can be detected higher/lower by the Sense-Amps 20. By coupling the noise from the I/O lines 24 and 26 symmetrically to the bit-lines 34a and 34b the relative voltage of the bit-lines does not change and therefore the Sense-Amps will not detect the wrong data.

Another feature of the present invention which helps to ensure that there are no erroneous data reads due to asymmetrical noise coupling is the use of a bit-line crossover 40 at the midpoint of the upper array. Because the I/O lines 24 and 26 are formed on a different interconnect level than the bit-lines 34a and 34b (I/O lines are formed in metal 3, while the bit-lines are formed in metal 2), mask alignment tolerances can shift the I/O lines 24 and 26 closer towards one of the bit-lines and thereby cause asymmetrical noise coupling. The bit-line crossover 40 is designed to resolve the potential problem of mask alignment tolerances. For example, if as shown in FIG. 4, the I/O lines 24 and 26 run closer to the BL# bit-lines 34a during their run over the first half the upper array (i.e. $d_1=a$, $d_2=b$, $a<b$), after the BL-BL# bit-line crossovers 40 they will run closer to the BL bit-lines during the second half of the upper array (i.e. $d_1=b$, $d_2=a$, $a<b$). The extra coupling which occurs to the BL# bit-lines in the first half of the upper array is compensated by the extra coupling to the BL bit-lines in the second half of the upper array. In this way, the bit-line crossover 40 prevents asymmetrical coupling which may result due to mask alignment tolerances.

The BL# and BL crossover 40 is implemented in the present invention by utilizing multilevel interconnect technology and crossing the BL-BL# bit-lines at different interconnect levels. In the present invention each of the bit-line pairs BL and BL# are formed in the metal 2 interconnect layer. After the 128th cell in the array (or the midpoint of the array 256/2) the BL bit-lines 34b drop down to metal 1 and cross over to where the BL# lines were previously routed. After the same cell, the BL# bit-lines 34a drop down to the polysilicon level and cross over to the location where the BL bit-lines were previously routed. After the crossovers 40, both the BL and BL# bit-lines are routed back up to metal 2. In this way the two bit-lines BL and BL# of a bit-line pair are able to "criss-cross" without breaking electrical connection or interacting. It is to be appreciated that there are a number of different interconnection techniques which may be used to accomplish the bit-line crossover 40. What is important is to provide a crossover near the midpoint of the array so that if there is mask misalignment between the bit-lines 34a and 34b and the I/O lines 24 and 26 there will still be symmetrical noise coupling to the bit-lines.

In the memory array of the present invention I/O buffers are provided on each of the I/O lines to help avoid noise coupling. In the present invention buffers are located at two places in the array, on the periphery of the upper array and in the I/O logic at the center of the array. The buffers 42 at the periphery of the array prevent noise from the outside of the array from being transmitted into the array on the I/O lines 24 and 26. That is, if a signal outside of the array transitions and this signal has high coupling to an I/O line, the I/O line voltage will be affected. If the I/O line is unbuffered, the coupled noise on the I/O line can be transmitted into the array and can affect, through capacitive coupling, the voltage on the bit-lines. Therefore, in the present invention there is an individual buffer 42 located at the periphery of the upper array for each of the Input and Output large-signal lines 24 and 26. The peripheral buffers 42 are tristate buffers which are enabled by I/O control logic 32. When the buffers are enabled signals can pass from the bus to the array and from the array to the bus. When the buffers are disabled they isolate the I/O lines over the upper array from noise external to the array. Additionally, in the present invention buffers are provided on the Output lines 26 in the Output cells 28 at the center of the array 10. These Output buffers 44 drive the output data out across the upper array 12 at predetermined times. A wide variety of well-known tristate buffers can be used as the peripheral I/O buffers 42 and the center Output buffers 44 in the present invention.

Additionally, in the present invention I/O control circuitry 32 is provided to ensure that the I/O lines 24 and 26 transition only at times when they will not affect the bit-lines 34a and 34b. That is, the bit-lines are only sensitive to noise interference at certain times. This time is during the read cycle and only during the read cycle when the bit-line voltage are being generated. The bit-lines 34a and 34b are no longer sensitive to noise interference once the Sense-Amps have determined the data that was read on the bit-lines. In the present invention the I/O lines 24 and 26 are only allowed to transition outside of the sensitivity window or outside of the time in which they can adversely affect the reading of data.

Figure 5:
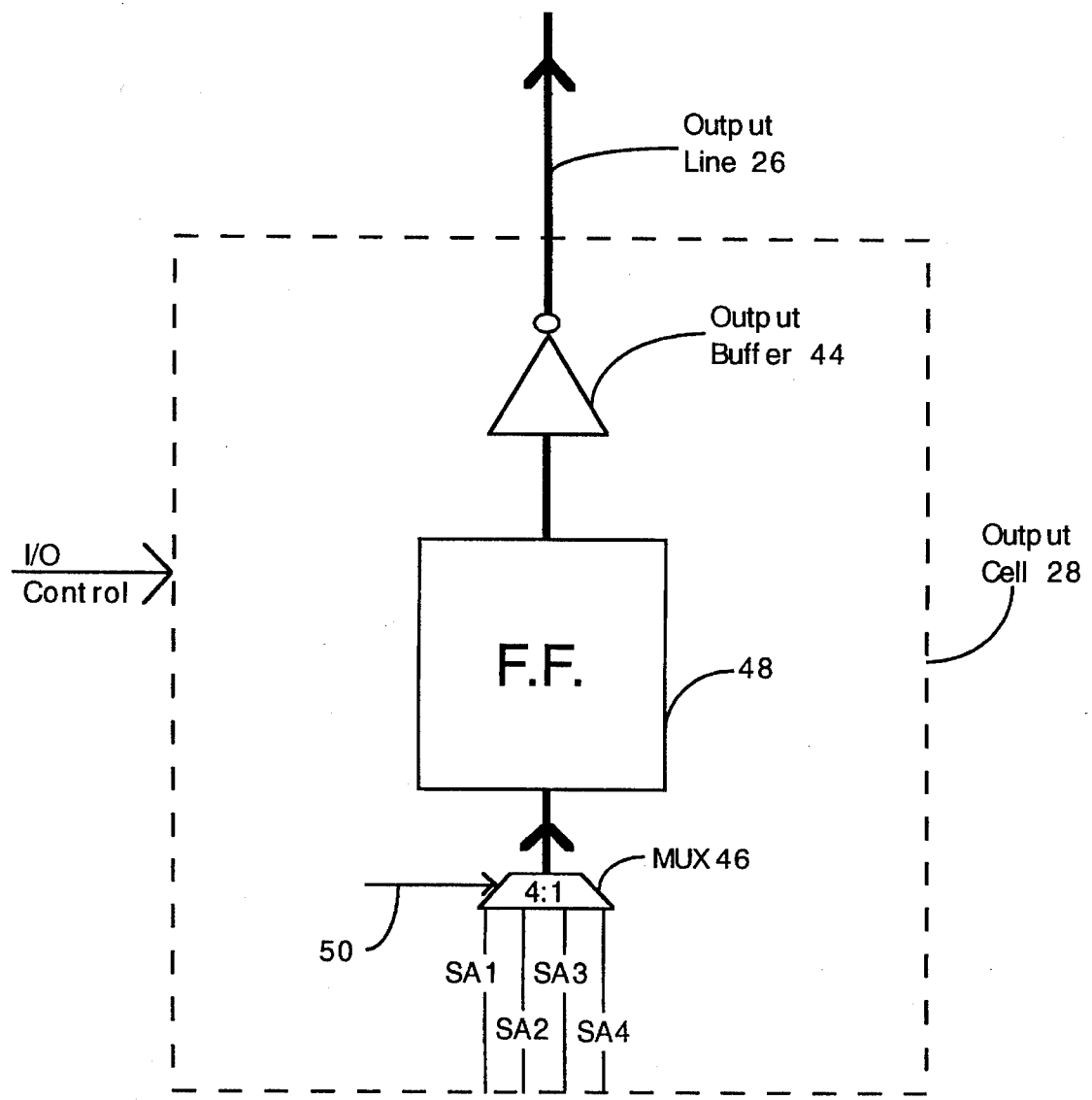
FIG. 5 is an illustration of an Output cell used in the present invention to drive Output data out over the array at predetermined times.

In the memory array of the present invention each of the Output data signal lines 26 is coupled to an individual output cell 28 at the center of the array 10 in the I/O logic 16. As shown in FIG. 5, the output cell 28 comprises a 4:1 MUX 46 coupled to a flip-flop 48 which in turn is coupled to an Output buffer 44 which drives the Output data line 26. A signal 50 supplied to the 4:1 MUX by an address decoder selects which data of four different Sense-Amps coupled to the output data line 26 is to be outputed. The selected value is stored in a flip-flop. When the output cell 28 receives a signal from the I/O control logic 32 which indicates that the critical read period has passed the data can then be outputed over the upper array 12 to the I/O bus 22 without causing data misreads. In the memory array of the present invention, there is a signal called Sense-Amp/Strobe whose function is to cause the Sense-Amps 20 to decide what data was on the bit-lines 34a and 34b. This signal represents the end of the critical phase or sensitivity window. The Sense-Amp/Strobe signal is therefore used to time the transfer (transition) of the output data onto the Output data lines 26 and out across the array. In the present invention the Output data lines 26 are not allowed to transition until after the Sense-Amp/Strobe signal. After the Sense-Amp/Strobe signal the output cell 28 is enabled by the I/O control logic 32 so that the data stored in the flip-flop 48 is driven out over the upper array by the Output buffer 44.

Additionally, in the present invention the Input data lines 24 are also not allowed to transition during the sensitivity window. As shown in FIG. 3, each of the data Input lines is coupled to a flip-flop 50. The plurality of flip-flops 50 comprise a Write Data Input Register. The I/O bus 22 supplies data to be written into the memory 10 to the flip-flops 50 of the Write Data Input Register. The data stored in the flip-flop 50 is not transferred over the upper array 12 until a signal is provided from the I/O control logic 32 which indicates that the memory has completed activity from the previous cycle. In the present invention there is a signal called "Active" which indicates when the memory 10 is in a read or write operation. The completion of the "Active" signal is used as an indication to transition the Input lines 24, if necessary, to present data to the array 10 to be written in the next cycle. In the present invention the buffers 42 at the periphery of the array coupled to the Input data lines are enabled only at the completion of the Active signal. In this way new data Input signals are not provided on the I/O lines over the array while data is being read. In the present invention the large-signal I/O lines 24 and 26 routed above the array never transition while the small-signal bit-lines 34a and 34b are being read. By controlling the times at which the I/O data lines 24 and 26 transition, to be outside of the critical phase of the read operation, the potential for data misreads due to noise coupling from the I/O lines 24 and 26 to the bit-lines 34 can be significantly reduced.

Thus, a novel memory array has been described. The memory array has the large-signal I/O lines of the array routed over a portion of the array itself. The novel routing allows a designer a great deal of freedom in choosing the shape and configuration of the memory array and the placement and orientation of the memory array relative to other logical blocks of an integrated circuit. A number of different techniques have been described which can be used alone or in combination to significantly reduce the adverse effects of noise coupling from the large-signal I/O lines over the array to the small-signal bit-lines.

I claim:

1. A semiconductor memory comprising:

a plurality of memory storage devices;

a plurality of small-signal lines for accessing data stored in said memory storage devices; and a plurality of large signal Input and Output lines for providing data to and from said memory, wherein said Input and Output lines are routed over a portion of said memory; and circuitry coupled to said Input and Output lines, said circuitry preventing noise external to said memory from being transmitted into said memory on said Input and Output lines over said memory.

2. The semiconductor memory of claim 1 wherein said I/O lines are routed symmetrically between said small-signal lines.

3. The semiconductor memory of claim 1 further comprising additional circuitry coupled to said Input and Output lines, said additional circuitry preventing said Input and Output lines over said memory from transitioning while data is being read on said small-signal lines.

4. A semiconductor memory array comprising:

a plurality of memory storage devices arranged in an array of rows and columns;

a plurality of bit-line pairs, each of said bit-line pairs comprising a first and a second bit-line wherein the relative voltage differential between said bit-lines of said bit-line pairs specifies the logical state of the data being read by said bit-line pair, said bit-line pairs for accessing data stored in said memory storage devices;

a plurality of large signal Input and Output lines for providing data to and from said memory array, wherein said Input and Output lines are routed over at least a portion of said memory array; and circuitry for preventing said Input and Output lines over said memory array from transitioning while voltage is being developed on said bit-line pairs.

5. The semiconductor memory array of claim 4 wherein said Input and Output lines are routed over said memory array in parallel with and at the center of said bit-lines of said bit-line pairs.

6. The semiconductor memory of claim 4 wherein the first and second bit-lines of said bit-line pairs cross at substantially the midpoint of said portion of said memory array over which said Input and Output lines are routed.

7. The semiconductor memory array of claims 4, 5, or 6 further comprising a plurality of buffers wherein a buffer is coupled to each of said Input and Output data lines at the periphery of said memory array.

8. The semiconductor memory array of claims 4, 5, or 6 further comprising a buffer coupled to each of said Output lines at the center of said memory array.

9. A very large scale on chip random access semiconductor memory array with a "butterfly" layout comprising:

a first memory array having a first plurality of storage devices arranged in rows and columns;

a second memory array having a second plurality of storage devices arranged in rows and columns;

I/0 logic coupled between said first and said second memory array, said I/0 logic capable of controlling the Input and Output of data to said memory array;

a plurality of bit-line pairs for reading data from and writing data into said storage devices, a bit-line pair for each column of said first and said second array, each of said bit-line pairs of said first array comprising a first and a second bit-line wherein the relative voltage differential between said first and said second bit-lines specifies the logical state of the data being read by said bit-line pair, wherein said first and said second bit-lines of said bit-line pairs cross-over at approximately the midpoint of said first array;

a plurality of Input and Output lines for providing data to and from said I/0 logic of said memory array, respectively, said individual Input and Output lines routed approximately symmetrically between and in parallel with said bit-lines of said bit-line pairs;

a first plurality of buffers provided on each of said Input and Output lines at the periphery of said first array, said buffers for preventing noise coupled to said Input and Output lines outside of said first array from being transmitted into said array on said Input and Output lines over said first array;

a second plurality of buffers provided on each of said Output lines in said I/0 logic at the center of said memory array for driving outputed data out of said array over said first array; and circuitry capable of preventing said Input and Output lines from transitioning while data is being read on said bit-lines of said first array.

10. The memory array of claim 9 wherein said storage devices are six-transistor CMOS SRAM cells.

11. The memory array of claim 9 wherein said first and said second array each comprise approximately 256×256 storage devices.

12. The memory array of claim 9 wherein there are approximately 128 Output and 128 Input data lines to said memory array.

13. The memory array of claim 9 wherein said first memory array is located near components which are coupled to said memory array.

14. A semiconductor memory comprising:

a plurality of memory storage devices;

a plurality of small signal lines for accessing data stored in said memory storage devices;

a plurality of large signal Input and Output lines for providing data to and from said memory, wherein said Input and Output lines are routed over a portion of said memory; and circuitry preventing said Input and Output lines over said memory from transitioning while data is being read on said small signal lines.

15. The semiconductor memory of claim 14 further comprising additional circuitry coupled to said Input and Output lines, said additional circuitry capable of preventing noise external to said memory from being transmitted into said memory on said Input and Output lines over said memory.

16. The semiconductor memory of claim 14 wherein said Input and Output lines are routed symmetrically between said small signal lines.

* * * * *

UNITED STATES PATENT AND TRADEMARK OFFICE
CERTIFICATE OF CORRECTION

PATENT NO. : 5,457,648
DATED : October 10, 1995
INVENTOR(S) : David Eisig

It is certified that error appears in the above-identified patent and that said Letters Patent is hereby corrected as shown below:

On the title page:

In the Abstract at [57] at line 9 delete "am" and insert --are--

In column 3 at line 54 delete "muting" and insert --routing--

In column 3 at line 57 delete "muting" and insert --routing--

In column 4 at line 60 delete "mad" and insert --read--

Signed and Sealed this

Twenty-ninth Day of July, 1997

Attest:

BRUCE LEHMAN

*Attesting Officer*  *Commissioner of Patents and Trademarks*